United States Patent
Wirth

(10) Patent No.: US 7,649,193 B2
(45) Date of Patent: Jan. 19, 2010

(54) SEMICONDUCTOR BODY AND SEMICONDUCTOR CHIP COMPRISING A SEMICONDUCTOR BODY

(75) Inventor: Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 123 days.

(21) Appl. No.: 11/904,204

(22) Filed: Sep. 26, 2007

(65) Prior Publication Data

US 2008/0073658 A1    Mar. 27, 2008

(30) Foreign Application Priority Data

Sep. 27, 2006  (DE) ........................ 10 2006 045 700
Dec. 7, 2006   (DE) ........................ 10 2006 057 747

(51) Int. Cl.
*H01L 31/00*    (2006.01)

(52) U.S. Cl. .............................. 257/12; 257/84; 257/91; 257/96; 257/E21.349

(58) Field of Classification Search .................. 257/12, 257/79, 84, 91, 96, 99, E21.349
See application file for complete search history.

(56) References Cited

U.S. PATENT DOCUMENTS

| | | | |
|---|---|---|---|
| 5,115,286 A | 5/1992 | Camras et al. | |
| 5,397,920 A | 3/1995 | Tran | |
| 5,861,636 A | 1/1999 | Dutta et al. | |
| 5,889,295 A | 3/1999 | Rennie et al. | |
| 5,977,565 A | 11/1999 | Ishikawa et al. | |
| 6,072,148 A | 6/2000 | Azdasht | |
| 6,271,050 B1 | 8/2001 | Akiba et al. | |
| 6,403,987 B1 | 6/2002 | Miki et al. | |
| 6,420,732 B1 | 7/2002 | Kung et al. | |
| 6,515,308 B1 | 2/2003 | Kneissl et al. | |
| 6,573,537 B1 | 6/2003 | Steigerwald et al. | |
| 6,614,056 B1 * | 9/2003 | Tarsa et al. | 257/91 |

(Continued)

FOREIGN PATENT DOCUMENTS

DE    198 20 777    11/1998

(Continued)

OTHER PUBLICATIONS

I. Schnitzer et al., "30% external quantum efficiency from surface textured, thin-film light-emitting diodes", Appl. Phys. Letter, vol. 63, No. 18, pp. 2174-2176, Oct. 18, 1993.

*Primary Examiner*—Evan Pert
*Assistant Examiner*—Scott R Wilson
(74) *Attorney, Agent, or Firm*—Cohen Pontani Lieberman & Pavane LLP

(57) ABSTRACT

A semiconductor body (2), comprising a semiconductor layer sequence with an active region (3) suitable for generating radiation. The semiconductor layer sequence comprises two contact layers (6, 7), between which the active region is arranged. The contact layers are assigned a respective connection layer (12, 13) arranged on the semiconductor body. The respective connection layer is electrically conductively connected to the assigned contact layer. The respective connection layer is arranged on that side of the assigned contact layer which is remote from the active region. The connection layers are transmissive to the radiation to be generated in the active region, and the contact layers are of the same conduction type.

21 Claims, 6 Drawing Sheets

U.S. PATENT DOCUMENTS

| | | |
|---|---|---|
| 6,657,236 B1 | 12/2003 | Thibeault |
| 6,847,056 B2 | 1/2005 | Noto et al. |
| 6,878,563 B2 | 4/2005 | Bader et al. |
| 2002/0043890 A1 | 4/2002 | Lu et al. |
| 2002/0074558 A1 | 6/2002 | Hata et al. |
| 2002/0096687 A1 | 7/2002 | Kuo et al. |
| 2002/0131462 A1 | 9/2002 | Lin et al. |
| 2002/0137244 A1 | 9/2002 | Chen et al. |
| 2002/0179918 A1 | 12/2002 | Sung et al. |
| 2002/0190263 A1 | 12/2002 | Hata et al. |
| 2003/0001249 A1 | 1/2003 | Shimanuki |
| 2003/0003613 A1 | 1/2003 | Hsieh et al. |
| 2003/0136442 A1 | 7/2003 | Takamoto |
| 2004/0046182 A1 | 3/2004 | Chen et al. |
| 2004/0090779 A1 | 5/2004 | Ou et al. |
| 2004/0104399 A1 | 6/2004 | Ou et al. |
| 2004/0120375 A1 | 6/2004 | Kwon |
| 2005/0145870 A1* | 7/2005 | Shakuda et al. ............... 257/99 |
| 2005/0158902 A1 | 7/2005 | Chua et al. |
| 2005/0205875 A1 | 9/2005 | Shei et al. |
| 2005/0207461 A1 | 9/2005 | Philippens et al. |

FOREIGN PATENT DOCUMENTS

| | | |
|---|---|---|
| DE | 100 20 464 | 11/2001 |
| DE | 103 46 605 | 3/2005 |
| DE | 10 2004 004 781 | 8/2005 |
| EP | 1 271 665 | 6/2002 |
| EP | 1 403 935 | 9/2003 |
| JP | 2000-353820 | 12/2000 |
| WO | WO 01/41223 | 6/2001 |
| WO | WO 01/41225 | 6/2001 |
| WO | WO 02/061855 | 8/2002 |

\* cited by examiner

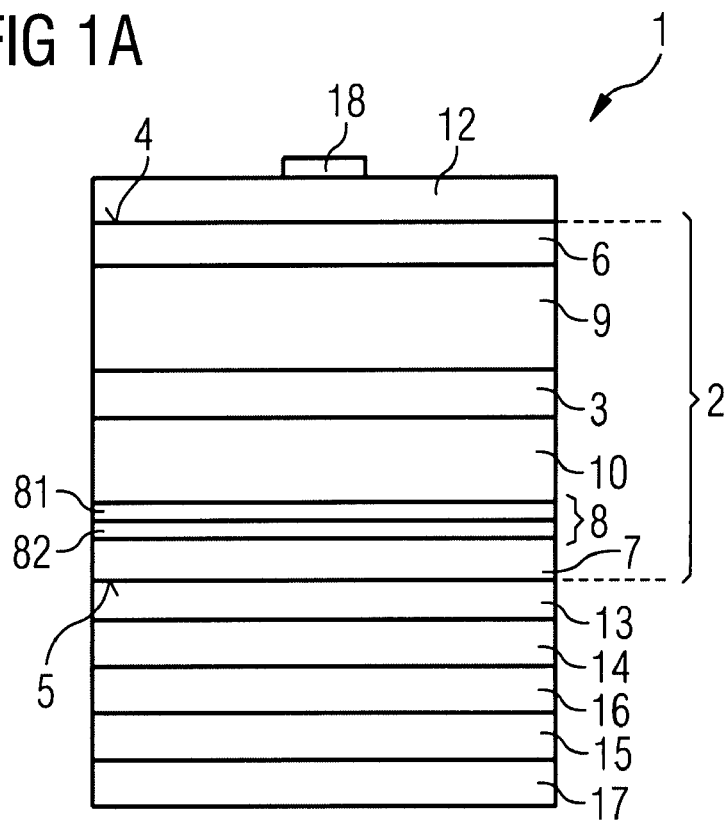
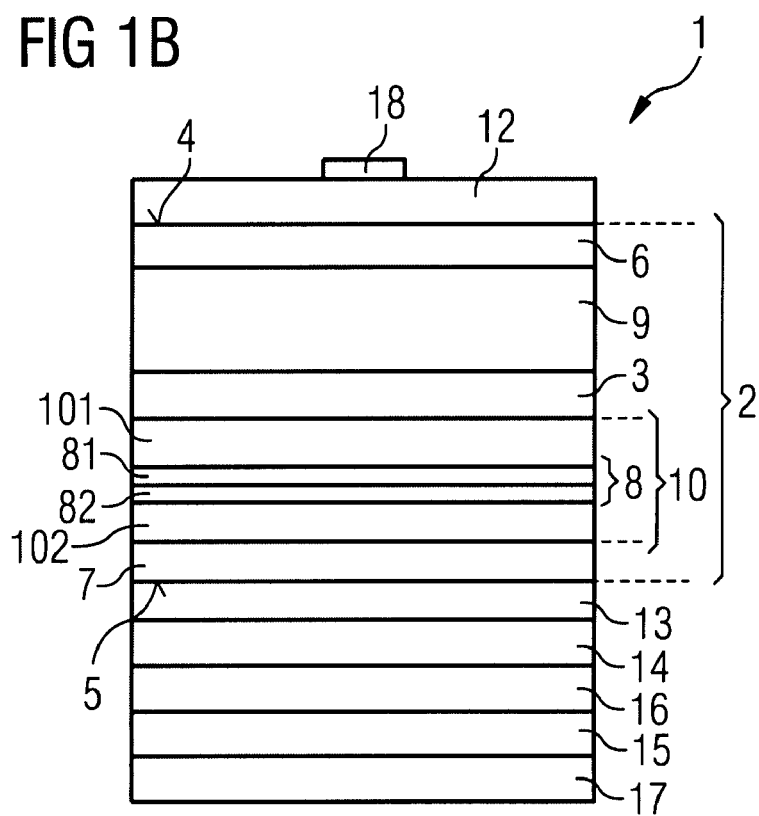

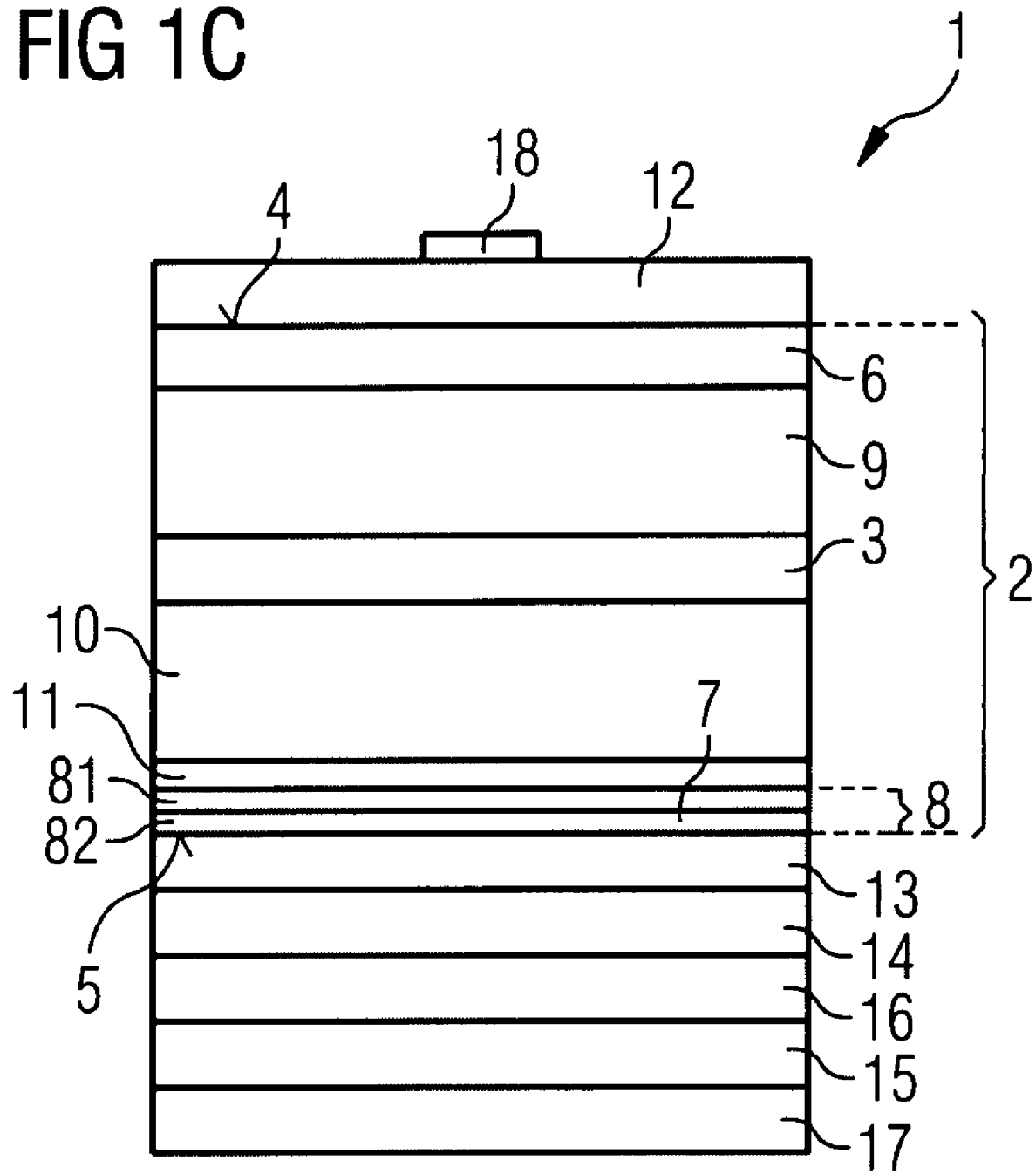

SEMICONDUCTOR BODY AND SEMICONDUCTOR CHIP COMPRISING A SEMICONDUCTOR BODY

RELATED APPLICATIONS

This patent application claims the priority of German patent applications 10 2006 045 700.5 filed Sep. 27, 2006, and 10 2006 057 747.7 filed Dec. 7, 2006, the entire disclosure content of both of which is hereby explicitly incorporated by reference.

FIELD OF THE INVENTION

The present invention relates to a semiconductor body and to a semiconductor chip comprising a semiconductor body.

SUMMARY OF THE INVENTION

It is an object of the present invention to provide a semiconductor body that is suitable for radiation emission and can be formed with high efficiency in a simplified manner.

A more specific object is to provide a semiconductor body that is efficient with regard to coupling out radiation, and an efficient semiconductor chip comprising a semiconductor body of this type.

This and other objects are attained in accordance with one aspect of the present invention directed to a semiconductor body that comprises a semiconductor layer sequence with an active region that is suitable for generating radiation. The semiconductor layer sequence comprises two contact layers, between which the active region is arranged, wherein the contact layers are assigned a respective connection layer arranged on the semiconductor body. The respective connection layer is electrically conductively connected to the contact layer assigned to said connection layer and is arranged on that side of the contact layer assigned to said connection layer which is remote from the active region. The connection layers are furthermore transmissive to the radiation to be generated in the active region, wherein the contact layers are of the same conduction type, such as, in particular being doped for the same conduction type.

Expediently, the active region and more widely the entire semiconductor body is arranged between the connection layers.

The contact layers in the semiconductor body are preferably formed for forming the electrical contact to the semiconductor body by means of the connection layer assigned to the respective contact layer. The connection layers are preferably embodied as separate layers, that is to say layers applied to the prefabricated semiconductor body. In this case, the connection layers are in particular not integrated in the semiconductor body. By way of example, the connection layers are applied to a semiconductor body grown epitaxially, after the epitaxy has ended. In particular, a method that is different from the production method for the semiconductor body can be used for the application of the connection layers.

A semiconductor body comprising contact layers of the same conduction type affords the advantage that connection layers which are particularly suitable for the conduction type of the contact layers can be employed. A connection layer can have different electrical contact properties to the contact layer depending on the conduction type of the contact layers—n-conducting or p-conducting. In particular, different contact properties to a predetermined connection layer can also occur in the case of contact layers composed identically apart from the doping. Since the conduction types of the contact layers are formed identically in the present case, an electrical contact whose contact properties to the respective connection layer are not influenced on account of different conduction types can be formed in a simplified manner by means of the connection layers to both contact layers.

Since the connection layers are formed such that they are radiation-transmissive to the radiation generated in the active region, it is possible to reduce or substantially completely avoid absorption losses in the connection layers when radiation passes through said layers. The radiation power passing through to that side of the connection layers which is remote from the semiconductor body can thus be increased.

Preferably, the connection layers contain a radiation-transmissive material or a radiation-transmissive material composition or consist of a material of this type or a material composition of this type.

In one preferred configuration the connection layers contain a radiation-transmissive and electrically-conductive oxide, in particular a metal oxide (TCO: Transparent Conductive Oxide). TCO materials are distinguished by high radiation transmissivity in conjunction with high electrical conductivity, in particular in a lateral direction. A TCO material is particularly suitable for a connection layer for a radiation-emitting semiconductor body, for example a semiconductor body fort a luminescence diode. Suitable TCO materials are, for example, a tin oxide such as SnO or $SnO_2$, a zinc oxide, such as ZnO, an indium tin oxide (ITO), or a titanium oxide, such as $TiO_2$.

In order to increase the conductivity, a TCO-containing connection layer can be doped. In particular, both connection layers can be doped. For ZnO, for example Al is suitable for the doping.

In a further preferred configuration, the connection layers contain identical materials, in particular the same TCO material, for example zinc oxide. Particularly preferably, the connection layers are composed identically. This has the advantage that, for forming contact to semiconductor materials, it is possible to use a particularly suitable material for the connection layer, such as a zinc oxide, for instance. In particular, it is possible to use a material in the case of which the formation of an electrical contact having the same kind of contact properties to semiconductor materials of both conduction types—p-conducting as well as n-conducting—is not possible or is possible only with very great difficulty.

Preferably, the contact layers have the same dopant concentration.

In a further preferred configuration, the contact layers are embodied in p-conducting fashion. P-conducting contact layers are particularly suitable for forming contacts to TCO materials, in particular to zinc oxide, for instance n-conducting zinc oxide. It has been found that the electrical contact by means of a TCO material to a p-conducting layer can be produced in a simplified manner with good contact properties, for example with a lower voltage drop, by comparison with the electrical contact to an n-conducting layer.

In a further preferred configuration, a connection layer adjoins the assigned contact layer. Preferably, one connection layer adjoins one contact layer and the other connection layer adjoins the other contact layer. The respective connection layer preferably adjoins the semiconductor body over the whole area. An intermediate layer, for example a semitransparent metal layer, for improving the electrical contact properties between a connection layer and the assigned contact layer can be dispensed with. Rather, semiconductor material of the semiconductor body with which good electrical contact can be made on both sides, may be offered by means of the contact layers of the same conduction type. The absorption of radiation in a metal intermediate layer can thus be avoided.

In a further advantageous configuration, a tunnel junction is arranged between one of the connection layers, in particular precisely one of the connection layers, and the active region. The tunnel junction is preferably integrated in the semiconductor layer sequence and particularly preferably comprises two, preferably highly-doped tunnel layers of different conduction types.

In this case, a tunnel layer of the tunnel junction that is remote from the active region can be formed as one of the contact layers or the tunnel junction can be arranged between one of the contact layers and the active region. In the former case, it is possible to dispense with an additional contact layer in the semiconductor body. In the latter case, by contrast, the tunnel junction and the contact layer can be formed independently of one another.

The tunnel layer remote from the active region and the contact layers preferably have the same conduction type. The tunnel layer facing the active region has a conduction type that differs from that of the contact layers.

By means of the tunnel junction, the contact layer can be electrically conductively connected with an advantageously low resistance to a semiconductor layer—arranged on the opposite side of the tunnel junction to the contact layer—of the semiconductor layer sequence, which has a conduction type that differs from the conduction type of the contact layer.

Despite the two contact layers having the same conduction type, the semiconductor body, starting from that side of the tunnel junction which faces the active region, can be formed with the conduction type profile of a conventional luminescence diode semiconductor body, that is to say p-conducting/active region/n-conducting or n-conducting/active region/p-conducting, respectively.

The tunnel junction is preferably arranged in the direct current path between a surface delimiting the semiconductor body, said surface expediently being formed by one of the contact layers, and the active region of the semiconductor body that is closest to said surface. In contrast to a semiconductor body comprising a plurality of active regions in which a tunnel junction is arranged between two active regions, in the present case the tunnel junction serves for electrically conductively connecting the contact layer to the active region and not for electrically coupling different active regions to one another. The semiconductor body can comprise, in particular, precisely one active region.

In a further preferred configuration, the tunnel layer facing the active region has the same conduction type as a semiconductor layer of the semiconductor layer sequence that is arranged between the active region and the tunnel junction, for example, a cladding layer of the semiconductor layer sequence. The conduction type of said semiconductor layer is expediently different from the conduction type of the contact layers.

In a further preferred configuration, a mirror layer is arranged on that side of one of the connection layers, in particular precisely one of the connection layers, which is remote from the semiconductor body. Radiation that is generated in the active region and passes through said connection layer can be reflected by means of the mirror layer. The radiation reflected by the mirror layer can enter into the semiconductor body again.

The radiation power that emerges from the semiconductor body via that side of the semiconductor body remote from the mirror layer can accordingly be increased by means of the mirror layer. Furthermore, it is possible to prevent absorption of radiation in elements arranged on that side of the mirror layer which is remote from the active region.

The tunnel junction can be arranged between the mirror layer and the active region or on that side of the active region which is remote from the mirror layer.

The mirror layer preferably contains a metal. Particularly preferably the mirror layer is formed in metallic fashion, in particular as a metallization, or as a metal-containing alloy. The alloy preferably has metallic character. By way of example, the mirror layer contains Au, Al or Ag or an alloy with at least one of said metals, such as AuGe.

The mirror layer is preferably applied to the connection layer, in particular deposited on the connection layer.

The mirror layer is preferably embodied in electrically conductive fashion and is particularly preferably connected to the active region in electrically conductive fashion. The mirror layer can accordingly serve for making electrical contact with the active region.

In a further preferred configuration, the semiconductor body contains a III-V semiconductor material. In particular, the active region, the tunnel layer(s), contact layer(s) and/or the semiconductor layer arranged between the tunnel junction and the active region can contain a III-V semiconductor material. III-V semiconductor materials are distinguished by high internal quantum efficiency in the generation of radiation.

Preferably the active region contains a material from the material system $In_xGa_yAl_{1-x-y}P$, where $0 \leq x \leq 1$, $0 \leq y \leq 1$ and $x+y \leq 1$. It may be the case here that $y \neq 0$, $y \neq 1$, $x \neq 0$ and/or $x \neq 1$. This material system is particularly suitable for generating radiation from the yellow through to the red spectral range.

The contact layers are preferably based on the same semiconductor material system, in particular a III-V semiconductor material system.

For forming electrical contact to a zinc oxide, a contact layer which contains a material from the material system $Al_yGa_{1-y}As$ where $0 \leq y \leq 1$, if appropriate, where $y \neq 0$, in particular a contact layer which contains or consists of GaAs or AlGaAs, is particularly suitable. By way of example, one of the contact layers contains, preferably both contact layers contain, GaAs or AlGaAs.

The contact layers can have the same composition with regard to the semiconductor material used and/or the dopant used, if appropriate, including the dopant concentration.

The tunnel layers are preferably based on the same semiconductor material system, in particular a III-V semiconductor material system. The tunnel layers can contain a material from the material system $Al_yGa_{1-y}As$ where $0 \leq y \leq 1$, if appropriate, where $y \neq 0$.

Preferably, the connection layer arranged on that side of the semiconductor body which is remote from the mirror layer is formed as a current spreading layer. Current passing into the current spreading layer via an electrical connection which is arranged on that side of the semiconductor body which is remote from the mirror layer, and which electrical connection is electrically conductively connected to the current spreading layer, can be distributed laterally in the current spreading layer and pass into the semiconductor body over a large area. In the case of a radiation-transmissive connection layer, it is possible to dispense with large-area connection structures, for instance large-area connection metallizations, for homogeneously impressing current.

The connection layer arranged between the semiconductor body and the mirror layer is expediently formed for forming electrical contact to the semiconductor body. Since the mirror layer is preferably provided in large-area fashion and is formed in electrically conductive fashion, it is not necessary for said connection layer to be formed as a current spreading layer. Since the electrical contact to the semiconductor body is formed by means of the connection layer, the mirror layer can be embodied in a manner optimized with regard to high reflectivity.

The connection layers can have different thicknesses. A connection layer formed for current spreading—for instance the connection layer arranged on that side of the semiconductor body which is remote from the mirror layer—is preferably made thicker than a connection layer serving principally for forming electrical contact.

In a further preferred configuration, the semiconductor body is embodied as a thin-film semiconductor body. In the case of a thin-film semiconductor body, the production substrate on which the semiconductor layer sequence for the semiconductor body was produced, in particular deposited, is removed in regions or completely. The production substrate is preferably the growth substrate on which the semiconductor layer sequence was grown epitaxially. The production substrate is preferably removed in such a way that that surface of the semiconductor body which faces the production substrate is accessible to further processing.

Since the production substrate has been removed, connection layers can advantageously be applied to the prefabricated semiconductor body on both sides —both on that side of the semiconductor body which faces the production substrate and on that side of the semiconductor body which is remote from the production substrate.

For the production of the thin-film semiconductor body, by way of example, firstly provision is made of a semiconductor layer sequence for the thin-film semiconductor body with an active region suitable for generating radiation and two contact layers of the same conduction type, which is arranged on a substrate, preferably the growth substrate of the semiconductor layer sequence. Afterward, a radiation-transmissive and electrically conductive connection layer is applied to the semiconductor body onto the side remote from the substrate, said connection layer being electrically conductively connected to one of the contact layers.

The substrate is thereupon removed and a further radiation-transmissive and electrically conductive connection layer is applied to the uncovered surface of the semiconductor body, said connection layer being electrically conductively connected to the other contact layer.

Another aspect of the present invention is directed to a semiconductor chip that comprises a semiconductor body according to an embodiment of the invention and a carrier, on which the semiconductor body is arranged. The semiconductor body is preferably connected to the carrier. For this purpose, a connecting layer can be formed between the semiconductor body and the carrier, in particular between the mirror layer and the carrier. The connecting layer is preferably formed in electrically conductive fashion and is particularly preferably connected to the active region in electrically conductive fashion.

The carrier stabilizes the semiconductor body preferably mechanically. The risk of damage to the semiconductor body—even with the growth substrate removed—can thus be reduced. The semiconductor body is preferably arranged on the carrier before the substrate is removed for the formation of a thin-film semiconductor body. The carrier differs from the production substrate, in particular the growth substrate of the semiconductor layer sequence.

A thin-film semiconductor chip, that is to say a chip comprising a thin-film semiconductor body which is arranged on a carrier that differs from the production substrate of the semiconductor layer sequence, can furthermore be distinguished by one or a plurality of the following features:

a reflective layer is applied or formed at a first main area—facing the carrier—of a radiation-generating epitaxial layer sequence, said reflective layer reflecting at least part of the electromagnetic radiation generated in the epitaxial layer sequence back into the latter;

the epitaxial layer sequence has a thickness in the range of 20 µm or less, in particular in the region of 10 µm; and/or the epitaxial layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behavior.

A basic principle of a thin-film light-emitting diode chip is described for example in I. Schnitzer et al., Appl. Phys. Lett. 63 (16), Oct. 18, 1993, 2174-2176, the disclosure content of which in this respect is hereby incorporated by reference.

A thin-film, light-emitting diode chip is to a good approximation a Lambertian surface emitter and is therefore particularly well suited to application in a headlight.

BRIEF DESCRIPTION OF THE DRAWINGS

FIGS. 1A, 1B and 1C show three exemplary embodiments of a semiconductor chip according to the invention on the basis of schematic sectional views.

DETAILED DESCRIPTION OF THE DRAWINGS

Figure 2A:
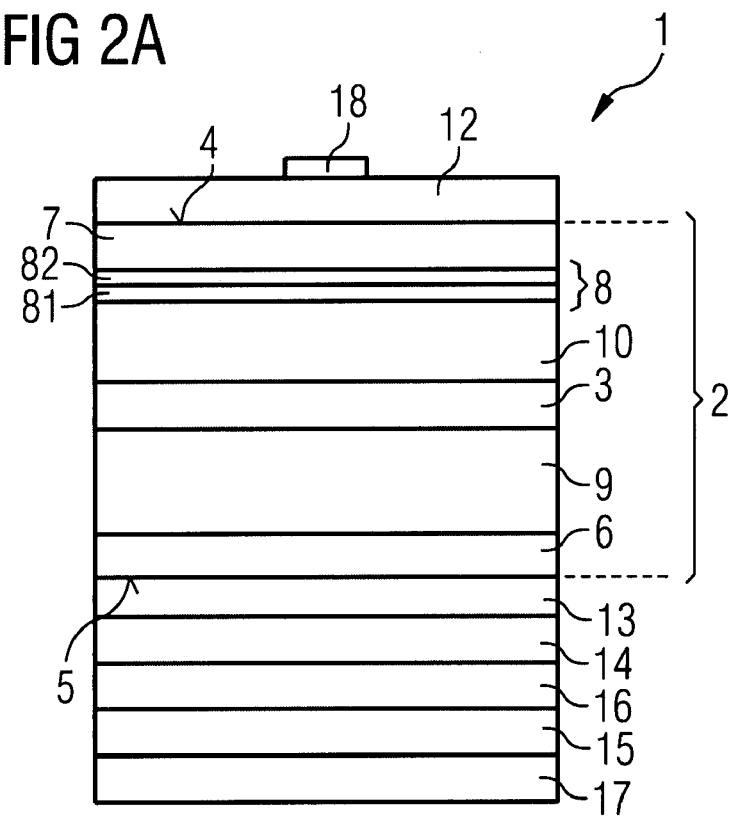
FIGS. 2A, 2B and 2C show three further exemplary embodiments of semiconductor chips according to the invention on the basis of schematic sectional views.

Elements which are identical, of identical type and act identically are provided with identical reference symbols in the figures. Furthermore, the figures are not necessarily drawn up true to scale, in particular with regard to the dimensions of the individual elements relative to one another. Rather, individual elements may be illustrated with an exaggerated size in the figures in order to afford a better understanding.

FIGS. 1A, 1B and 1C show three exemplary embodiments of a semiconductor chip according to the invention on the basis of schematic sectional views.

The semiconductor chip 1 comprises a semiconductor body 2 in each case. The semiconductor body 2 comprises a semiconductor layer sequence with an active region 3 suitable for generating radiation. The semiconductor layer sequence comprises a plurality of semiconductor layers. In particular, the semiconductor body 2 is preferably formed by the semiconductor layer sequence.

The semiconductor body 2 is furthermore formed as a luminescence diode semiconductor body for generating radiation, preferably as an LED semiconductor body for generating incoherent radiation.

Furthermore, the semiconductor body 2 has a top side 4 and an underside 5. The top side 4 is preferably formed for the radiation coupling out of radiation generated in the active region from the semiconductor body 2 (coupling out side). The underside 5 preferably serves as a mounting side, on the part of which the semiconductor body 2 is mounted on a carrier element, for example directly onto a connection carrier, for instance a, preferably printed, circuit board (not explicitly illustrated).

The semiconductor layer sequence furthermore comprises a first contact layer 6 and a second contact layer 7. The active region 3 is arranged between the contact layers 6, 7. The contact layers 6, 7 are doped for the same conduction type— p-conducting or n-conducting. The contact layers 6, 7 are preferably formed for forming external electrical contacts to the semiconductor body. The contact layers 6, 7 expediently delimit the semiconductor body 2 on the part of the top side and underside respectively.

Furthermore, a tunnel junction 8 is monolithically integrated in the semiconductor layer sequence. The tunnel junction 8 comprises a first tunnel layer 81 and a second tunnel layer 82. The tunnel layers 81 and 82 are doped for different conduction types. Furthermore, the tunnel junction 8 is arranged between the underside 5 of the semiconductor body 2 and the active region 3 in the semiconductor body. The second tunnel layer 82 remote from the active region 3 preferably has the same conduction type as the contact layers 6, 7.

The semiconductor layer sequence furthermore comprises a first cladding layer 9 or a corresponding cladding layer sequence and a second cladding layer 10 or a corresponding cladding layer sequence. The active region is arranged between the first cladding layer 9 and the second cladding layer 10. The first cladding layer 9 is furthermore arranged between the first contact layer 6 and the active region 3. The cladding layer 10 is arranged between the second contact layer 7 and the active region 3. The cladding layers 9 and 10 are doped for different conduction types. The cladding layer 9 arranged on that side of the active region remote from the tunnel junction 8 preferably has the same conduction type as the contact layers 6, 7.

The differences between the semiconductor bodies 2 illustrated in FIGS. 1A, 1B and 1C are manifested in the arrangement of the tunnel junction 8 in the respective semiconductor body.

In the exemplary embodiment in accordance with FIG. 1A, the tunnel junction 8 is arranged between the second contact layer 7 and the active region, and in particular between the second contact layer 7 and the second cladding layer 10.

In the exemplary embodiment in accordance with FIG. 1B, the tunnel junction 8 is integrated into the cladding layer sequence 10 and is therefore arranged nearer to the active region by comparison with FIG. 1A. In this case, the cladding layer sequence has two cladding layers 101 and 102 between which the tunnel junction is arranged.

Accordingly, a separate second contact layer 7 separated from the tunnel junction is in each case provided in the semiconductor bodies 2 in accordance with FIGS. 1A and 1B.

In contrast to this, the second tunnel layer 82—remote from the active region 3—of the tunnel junction in the exemplary embodiment in accordance with FIG. 1C is formed as second contact layer 7. A semiconductor layer 11 can be arranged between the tunnel junction and the cladding layer 10.

Layers of the semiconductor layer sequence that are arranged between the tunnel junction 8 and the underside 5 are preferably doped for the same conduction type as the contact layers 6 and 7 (cf. for example, the cladding layer 102 in FIG. 1B). Layers of the semiconductor layer sequence arranged between the tunnel junction 8 and the active region 3 are preferably doped for the opposite conduction type to the contact layers (cf. the cladding layers 10 in FIGS. 1A and 1C, the cladding layer 101 in FIG. 1B and the semiconductor layer 11 in FIG. 1C).

The cladding layer sequence 10 can in particular have, in addition to the tunnel junction 8, two semiconductor layers of different conduction types (cf. the cladding layers 101 and 102 in accordance with FIG. 1B).

What can be achieved by means of the tunnel junction 8 is that an electrical coupling of the underside 5 of the semiconductor body to the active region 3, which electrical coupling is of comparatively low resistance, that is to say relative to dispensing with the tunnel junction, is obtained despite the two contact layers of the same conduction type. If the tunnel junction is dispensed with, then a crucially blocking pn junction can form between the underside and the active region. A feeding of charge carriers to the active region for irradiative recombination would thus be considerably inhibited and the efficiency of the semiconductor body consequently would be reduced.

If, by way of example, the contact layer 7 and the cladding layer 10 in FIG. 1A adjoined one another, then a crucially blocking pn junction of the this type would form.

By means of the tunnel junction 8, it is possible to realize a low-resistance charge carrier feeding to the active region 3 despite the layers of different conduction types—the cladding layer 10 or 101 and the second contact layer 7—that are arranged between the active region and the underside 5.

Furthermore, the tunnel layers 81 and 82 are preferably formed such that they are highly doped, preferably with a dopant concentration of $1*10^{18}$ $1/cm^3$ or more, particularly preferably of $1*10^{19}$ $1/cm^3$ or more, most preferably of $1*10^{20}$ $1/cm^3$ or more.

The tunnel layers 81 and 82 preferably have a higher dopant concentration than a layer of the same conduction type which, if appropriate, adjoins the respective tunnel layer in the semiconductor body.

A thickness of the respective tunnel layer is preferably 20 nm or less, particularly preferably 10 nm or less.

The semiconductor body 2 is arranged between a first connection layer 12 and a second connection layer 13. These connection layers are preferably applied to the top side 4 (connection layer 12) and respectively the underside 5 of the semiconductor body 2 (connection layer 13). The semiconductor body 2 has already been prefabricated before the application of the connection layers.

Furthermore, the connection layers 12 and 13 preferably directly adjoin the semiconductor body 2. The connection layers 12 and 13 are formed from a material that is transmissive to the radiation generated in the active region 3, or from a corresponding material composition. TCO connection layers, for example composed of zinc oxide, tin oxide, indium tin oxide or titanium oxide (cf. the description further above) are particularly suitable. The connection layer can be suitably doped in order to increase the conductivity. Al is suitable for ZnO, for example.

Since both contact layers 6, 7 have the same conduction type, it is possible to choose a conduction type which is particularly suitable for forming contact to TCO materials. In particular, the same TCO material can be used for both connection layers 12 and 13. The contact properties of a TCO material to the semiconductor material of the semiconductor body often depend on the conduction type of the semiconductor material.

By means of a metallic intermediate layer between the TCO material and the semiconductor body, although it is possible, if appropriate, to produce a good electrical contact even to a semiconductor material of the less suitable conduction type, radiation generated in the active region would be absorbed in the metallic intermediate layer and consequently reduce the efficiency of the coupling out of radiation from the chip. Since, in the case of the semiconductor body 2, two layers of the same conduction type are available for forming contacts to the semiconductor body, an intermediate layer can be dispensed with.

Zinc oxide, for example, is distinguished by particularly good electrical contact properties to p-conducting semiconductor material, in particular p-doped GaAs or p-doped AlGaAs. An n-conducting zinc oxide is preferably used as zinc oxide. Although a tunnel contact forms between a p-conducting contact layer and n-conducting zinc oxide, it generates only a small voltage drop and does not critically reduce the efficiency of the semiconductor chip.

The electrical contact between the connection layer and the contact layer can have an essentially ohmic current-voltage characteristic.

Preferably, the contact layers 6 and 7 contain or consist of p-GaAs or p-AlGaAs. In particular, an Al content of 0.6 or less, preferably of 0.5 or less, particularly preferably of 0.3 or less is suitable for an AlGaAs-containing contact layer.

The active region 3 is preferably formed for generating visible radiation. By way of example, the active region contains InGaAlP. This III-V semiconductor material is particularly suitable for generating radiation from the yellow through to the red spectral range.

The tunnel layers 81 and 82 preferably contain or consist of GaAs or AlGaAs.

The cladding layers 10, 101, 102 are preferably based on $In_xGa_yAl_{1-x-y}P$.

(Al)GaAs-based semiconductor layers and semiconductor layers based on $In_xGa_yAl_{1-x-y}P$ can be grown epitaxially one on top of another.

In a preferred configuration, the contact layers 6 and 7 are embodied in a highly-doped fashion. For this purpose, the contact layers 6 and 7 expediently have a higher dopant concentration than a layer in the semiconductor body of the same conduction type. A dopant concentration of the contact layers is preferably $1*10^{18}$ 1/cm$^3$ or greater, $1*10^{19}$ 1/cm$^3$ or greater, most preferably $1*10^{20}$ 1/cm$^3$ or greater.

Dopant concentrations of this type are particularly suitable for forming contact to a TCO material, in particular for contact layers based on (Al)GaAs with regard to the formation of a good electrical contact to ZnO, if appropriate to ZnO:Al.

As dopant, for the layers of the semiconductor body 2, for a p-conducting doping, for example Mg or C is suitable as acceptor, and for an n-conducting doping for example Si is suitable as donor. C is particularly suitable for high dopant concentrations, in particular for semiconductor materials based on GaAs, such as e.g. (Al)GaAs-based materials. The tunnel layer(s) and/or the contact layer(s) are preferably doped with C.

In a further preferred configuration, the contact layers 6 and 7 have the same composition, preferably including the doping, that is to say the dopant used and/or the dopant concentration. By this means, an identical kind of electrical contact to the semiconductor body can be formed on both sides in a simplified manner.

The first contact layer and/or the second contact layer preferably have a thickness of 100 nm or less, particularly preferably of 50 nm or less, in particular of 20 nm or less. Such small thicknesses may already suffice for forming electrical contact to the connection layers. The two contact layers can have the same thickness.

A mirror layer 14 is arranged on that side of the second connection layer 13 which is remote from the semiconductor body 2. The mirror layer 14 preferably directly adjoins the second connection layer 13.

By way of example, the mirror layer 14 contains a metal, in particular Au or consists of a metal. A mirror layer containing an alloy, for example AuGe, can also be used. These materials are distinguished by particularly high reflectivities for radiation that can be generated in the material system $In_xGa_yAl_{1-x-y}P$.

Mirror layers having metal character are furthermore distinguished by an advantageously low dependence of the reflectivity on the angle of incidence of the radiation.

By means of the mirror layer 14, radiation that is generated in the active region 3 and impinges on the mirror layer after passing through the second connection layer 13 can be reflected back into the semiconductor layer sequence and emerge via that side of the first connection layer 12 remote from the semiconductor body. The radiation power emerging on the coupling-out side is thus advantageously increased. Furthermore, the absorption of radiation in structures arranged on that side of the mirror layer which is remote from the active region 3 can be prevented by means of the mirror layer.

The semiconductor body 2 is furthermore embodied as a thin-film semiconductor body. For this purpose, the semiconductor body 2 is grown epitaxially on a growth substrate, for example by means of MOVPE. GaAs, for example, is suitable as a growth substrate for the semiconductor material systems mentioned above.

For the thin-film semiconductor body, the growth substrate is removed from the semiconductor body after the growth process and therefore is not illustrated in the figures. The growth substrate can be removed by means of etching or laser separation. On account of the removed growth substrate, after the epitaxy of the semiconductor body, TCO connection layers can be deposited on the semiconductor body 2 on both sides. Preferably, a method that is different from the process for producing the semiconductor body 2 is used, in particular no epitaxy method is used, for the deposition of the connection layers 12, 13. By way of example, a PVD method (PVD: Physical Vapor Deposition), such as sputtering or vapor deposition, or a CVD method, such as PECVD (PECVD: Plasma Enhanced Chemical Vapor Deposition), are suitable for the deposition of the connection layers.

For the thin-film semiconductor chip 1, the semiconductor body 2 is fixed on a carrier 15. The latter is different from the growth substrate of the semiconductor layer sequence. By way of example, the carrier contains or consists of GaAs or Ge.

The mirror layer 14 can be deposited on the connection layer 13, for example by means of vapor deposition or sputtering.

For the purpose of fixing the semiconductor body 2 on the carrier 15, a preferably electrically conductive, connecting layer 16 is arranged between the mirror layer 14 and the carrier. The connecting layer 16 may be formed as a solder layer or an electrically conductive adhesive layer, for example as a silver conductive adhesive layer.

A connection 18, for example, a connection metallization, is arranged on the top side 4 of the semiconductor body 2, in particular on that side of the first connection layer 12 which is remote from the semiconductor body. The connection 18 is electrically conductively connected to the active region 3 via the first connection layer 12. The connection 18 is preferably formed for connection to a bonding wire.

A counter-connection 17 is arranged on that side of the second connection layer 13 which is remote from the active region 3, in particular on that side of the carrier 15 which is remote from the active region 3. The counter-connection 17 is electrically conductively connected to the active region via the mirror layer 14 and in particular via the connecting layer 16 and the carrier 15.

Electrical contact can be made with the active region 3 via the connection 18 and the counter-connection 17. In this case, the tunnel junction 8 enables a low-barrier charge carrier transport from the connections 17, 18 to the active region 3 despite the contact layers 6 and 7 of the same conduction type.

The connection layer 12 on the top side is preferably formed as a current spreading layer. Charge carriers injected into the first connection layer 12 via the connection 18 arranged on the coupling-out side can be distributed in a lateral direction in the current spreading layer. Compared with the relatively small-area embodiment of the connection 18, a larger-area charge carrier injection into the semiconductor body can be obtained by means of the current spreading.

The second connection layer 13 serves principally for forming electrical contact to the semiconductor body. Current spreading is not necessary on account of the electrically conductive mirror layer 14 formed in large-area fashion. The current can already be injected into the connection layer on the underside over a large area via the mirror layer. Accordingly, a lateral distribution of the current over the underside of the semiconductor body is already obtained on that side of the connection layer 13 which is remote from the semiconductor body.

A connection layer having a thickness of 200 nm or greater is particularly suitable for a current spreading layer in which charge carriers are distributed laterally. The first connection layer 12 therefore preferably has a thickness of 200 nm or more, particularly preferably of 300 nm or more or of 400 nm or more.

By contrast, a connection layer having a smaller thickness, for example of 100 nm or less, may already suffice for forming an electrical contact without crucial current spreading. Since the current can already pass into the semiconductor body over a large area on the part of the underside 5 via the large-area counter-connection 17 and the large-area mirror layer 14, current spreading is not particularly advantageous on this side. Therefore, from this standpoint, the second connection layer 13 can be made comparatively thin, and have e.g. a thickness of 150 nm or less, particularly preferably of 100 nm or less.

It has been found that a comparatively thick second connection layer is particularly advantageous for obtaining a high integral reflectivity (total reflectivity) of a mirror structure comprising the second connection layer 13 and the mirror layer 14. A comparatively thin second connection layer 13 can (concomitantly) cause resonance effects which can lead to inhomogeneities in the dependence of the reflectivity of the mirror structure on the angle of incidence of radiation on the mirror structure. For an integral reflectivity of the mirror structure that is more homogeneous, that is to say less dependent on the angle of incidence, a thickness of the second connection layer of 400 nm or more, preferably of 500 nm or more, has proved particularly advantageous. The influence of resonance effects on the integral reflectivity can thus be reduced.

On the coupling-out side, the area of the connection 18 should be kept comparatively small in order that the radiation power absorbed in the connection 18 is not increased unnecessarily. Current spreading in a radiation-transmissive connection layer therefore entails considerable advantages on this side of the semiconductor body.

Figure 2B:
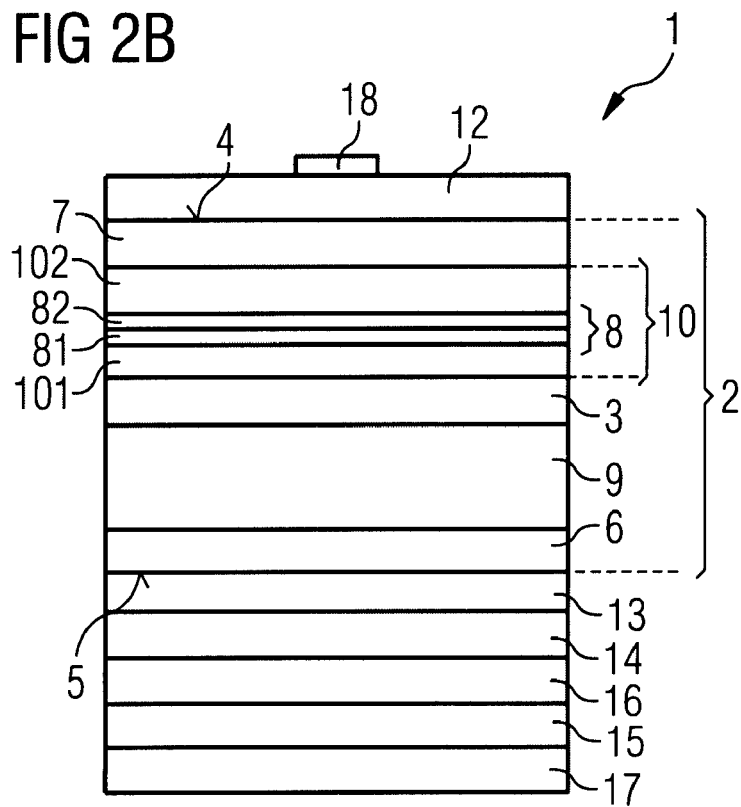
Figure 2C:
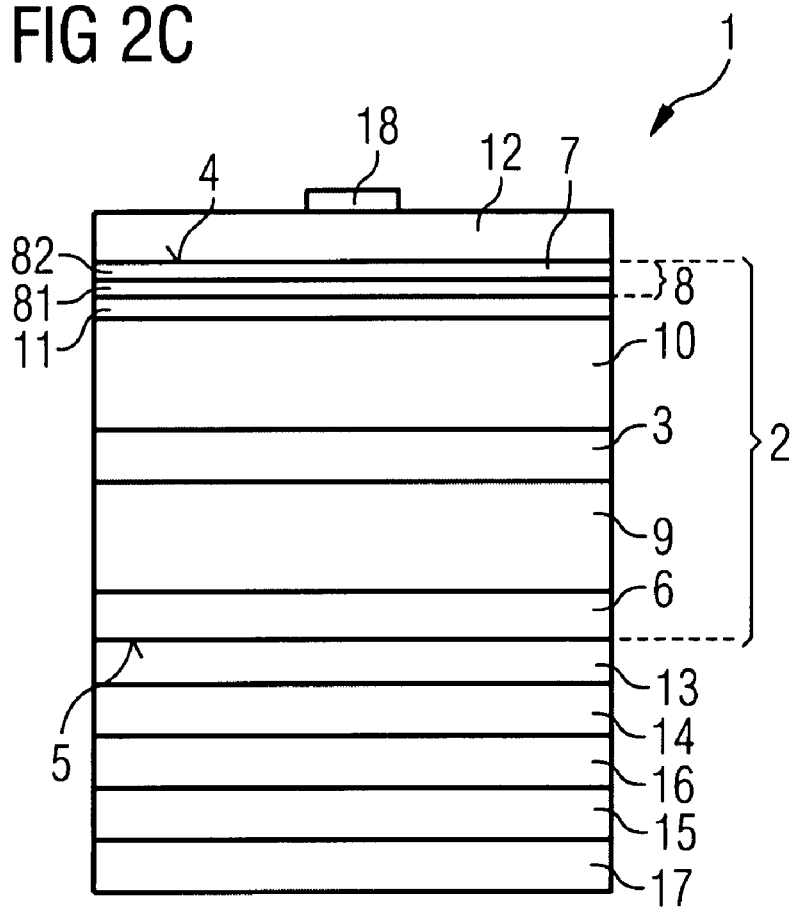

FIGS. 2A, 2B and 2C show three further exemplary embodiments of semiconductor chips according to the invention on the basis of schematic sectional views.

The semiconductor chips illustrated in FIGS. 2A, 2B and 2C essentially correspond to the figures respectively designated in the same way in FIGS. 1A, 1B and 1C, that is to say that FIG. 2A corresponds to FIG. 1A, FIG. 2B corresponds to FIG. 1B and FIG. 2C corresponds to FIG. 1C. In contrast to FIGS. 1A-1C, in the case of the semiconductor chips 1 in accordance with FIGS. 2A-2C, the tunnel junction 8 is arranged between the first connection layer 12 and the active region 3 and in particular on that side of the active region 3 which is remote from the mirror layer 14.

The semiconductor bodies 2 in accordance with FIGS. 2A-2C have, as seen from the underside 5, the same layer sequence as the corresponding semiconductor bodies 2 in FIGS. 1A-1C as seen from the top side. Accordingly, the semiconductor bodies in accordance with FIGS. 2A-2C are arranged the other way round on the mirror layer by comparison with the corresponding semiconductor bodies from FIGS. 1A-1C.

Figure 3:
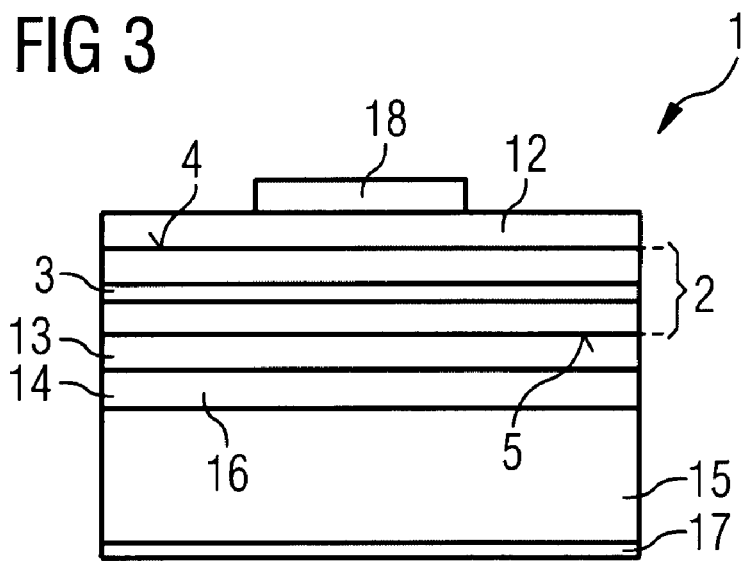
FIG. 3 shows an exemplary embodiment of a semiconductor chip according to the invention on the basis of a schematic sectional view.

FIG. 3 shows a simplified illustration of a semiconductor chip 1 on the basis of a schematic sectional view. In this case, the semiconductor chip essentially corresponds to the semiconductor chips described in connection with FIGS. 1A-1C and FIGS. 2A-2C, a detailed illustration of individual elements of the semiconductor body 2 and individual illustrations of the mirror layer 14 and the connecting layer 16 having been dispensed with for reasons of clarity. In this case, the semiconductor body 2 can be embodied according to the semiconductor bodies described in connection with FIGS. 1A-1C and FIGS. 2A-2C.

Charge carriers passing into the semiconductor body 2 in the region below the small-area connection 18, which is embodied as a bonding pad, for example, increasingly lead in the active region to generation of radiation below said connection. In general, a not inconsiderable portion of the radiation portion generated below the connection 18 is absorbed in said connection.

In order to increase the coupling-out efficiency of the semiconductor chip 1, therefore, it is advantageous to reduce, in a targeted manner, generation of radiation in that zone of the active region 3 which is covered by the connection 18. In this case, coupling-out efficiency should be understood to mean the ratio of the radiation power generated in the semiconductor body to the radiation power coupled out from the semiconductor chip.

Measures suitable for this are explained in more detail in connection with FIGS. 4A and 4B.

Figure 4A:
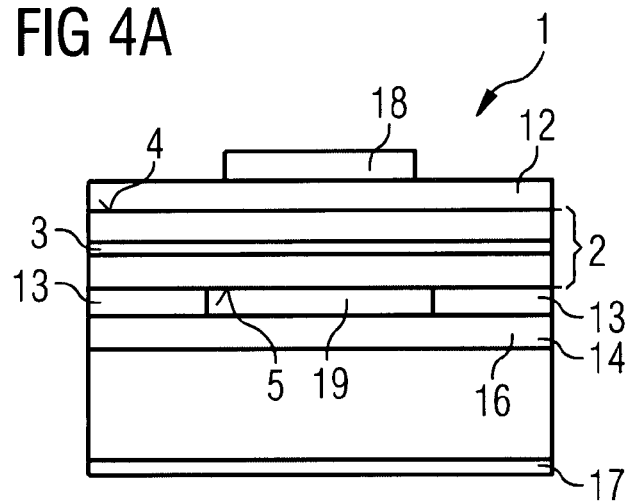
FIGS. 4A and 4B show two further exemplary embodiments of semiconductor chips according to the invention on the basis of schematic sectional views.
Figure 4B:
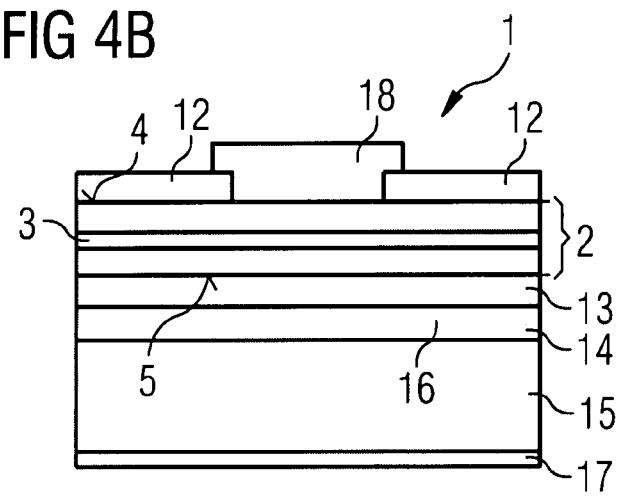

FIGS. 4A and 4B show two further exemplary embodiments of semiconductor chips 1 on the basis of schematic sectional views. These views essentially correspond to the simplified view from FIG. 3. In contrast thereto, these chips are formed in such a way that generation of radiation below the connection 18 is reduced.

The semiconductor chip 1 shown in FIG. 4A has an insulating means on that side of the active region 3 which is remote from the connection 18, which insulating means reduces charge carrier injection into the active region in the zone covered by the connection 18.

As insulating means, an electrically insulating layer 19, for example a silicon nitride layer, is applied, in particular deposited onto the semiconductor body on that side of the active region which is remote from the connection 18. The insulating layer 19 preferably completely covers the connection 18 and is particularly preferably widened laterally relative to the connection 18. The insulating layer 19 is preferably arranged between the active region 3 and the mirror layer 14.

By means of the insulating layer 19 it is possible to reduce the injection of charge carriers into the semiconductor body in the region below the connection 18. This reduces advantageously the radiation power generated in the region below the connection and correspondingly also the radiation power that can be absorbed in the connection 18.

By virtue of the lateral widening of the insulating layer 19 relative to the dimensioning of the connection 18, it is possible to reduce the entry of charge carriers into the zone below the connection on account of the current spreading in the semiconductor body.

The insulating layer 19 is preferably arranged in a cut-out of the second connection layer 13 on the underside. The direct current path between the mirror layer 14 and that zone of the active region 3 which is covered by the connection 18 is therefore interrupted in the region of the insulating layer.

The generation of radiation in the active region is consequently concentrated on regions not covered by the connection 18. The radiation power that can be absorbed in the connection 18 is thereby advantageously reduced. Overall, the radiation power emerging via that side of the first connection layer 12 which is remote from the active region 3 can thus be increased.

As an alternative, or in supplementation to the formation of a (buried) insulating means on the underside, as described in connection with FIG. 4A, an insulating means can also be formed on the top side, FIG. 4B.

By way of example, it is possible to reduce the impression of charge carriers below the connection 18 into the semiconductor body 2 by means of an insulating layer arranged between the connection 18 and the semiconductor body (not explicitly illustrated).

In the case of a direct mechanical contact of the connection 18 to the semiconductor body 2, it is possible to reduce charge carrier injection in the mechanical contact region of the connection to the semiconductor body through suitable selection of the material adjoining the connection on the part of the semiconductor body. By way of example, the first connection layer 12 can be formed with a cut-out, into which the connection 18 is introduced. On the edge side in the cut-out and preferably also on that side of the connection layer 12 which is remote from the semiconductor body 2, the connection 18 is electrically conductively connected, in particular directly, to the connection layer. At the bottom of the cut-out, the connection 18 directly adjoins the semiconductor body.

In order to reduce the charge carrier injection below the connection 18, it is possible to use for example on the part of the semiconductor body a metal for the connection 18, which metal forms a Schottky barrier with the adjoining material on the part of the semiconductor body. The formation of a zone of high resistance in the semiconductor body 2 in the contact region of the semiconductor body to the connection 18, for example by implantation into the semiconductor body, for instance proton implantation is also suitable for this purpose. Charge carriers then pass, proceeding from the counter-connection, predominantly via the first connection layer 12 into the semiconductor body 2. Direct charge carrier injection into the semiconductor body via the connection 18 is consequently reduced.

Figure 5:
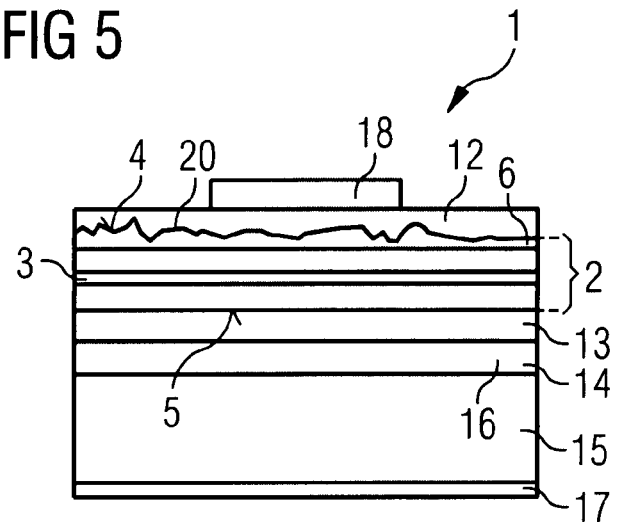
FIG. 5 shows a further exemplary embodiment of a semiconductor chip according to the invention on the basis of a schematic sectional view.

FIG. 5 shows a further exemplary embodiment of a semiconductor chip 1 on the basis of a schematic sectional view. The semiconductor chip essentially corresponds to the semiconductor chips described in connection with the previous FIGS. 1A to 3.

In contrast thereto, the semiconductor body 2 is provided with a surface structure 20. The surface structure is preferably formed on the top side, in particular on that side of the semiconductor body 2 which is remote from the mirror layer. The radiation power coupled out from the semiconductor body on the part of the structured area can be increased by means of the surface structure 20.

By means of such a coupling-out structure, which can be embodied as roughening, for example, it is possible to disturb the reflection, in particular the total reflection at the structured surface of the semiconductor body 2. The passage of radiation through said surface is thus facilitated.

The surface structure 20 can be formed in particular in the respective contact layer on the top side (shown for the contact layer 6 in FIG. 5). Said contact layer thus simultaneously provides for a good electrical contact to the connection layer and contributes to increasing the radiation power coupled out from the semiconductor body 2. Such a coupling-out structure can be produced by means of roughening the semiconductor body, for example by etching.

Figure 6:
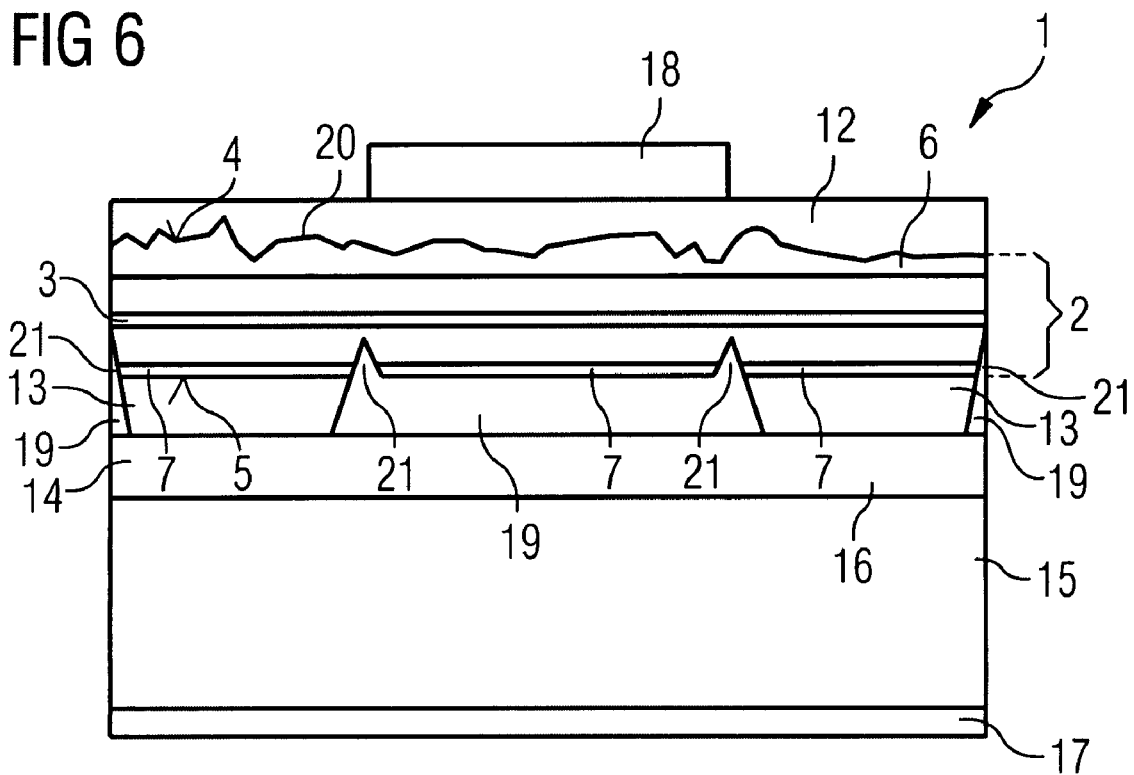
FIG. 6 shows a further exemplary embodiment of a semiconductor chip according to the invention on the basis of a schematic sectional view.

FIG. 6 shows a further exemplary embodiment of a semiconductor chip 1 on the basis of a schematic sectional view. The semiconductor chip essentially corresponds to the semiconductor chips described in connection with FIGS. 4A and 5.

In contrast thereto, the semiconductor body 2 of the chip has one or a plurality of cut-outs 21 on the part of the underside 5. The cut-out 21 extends from the underside 5 of the semiconductor body 2 in the direction of the active region 3, but preferably does not break through the latter. The cut-out 21 preferably has an oblique lateral surface. Radiation impinging on the lateral surface of the cut-out from the active region 3 can be reflected at said surface. On account of the beveled formation of the cut-out, the reflection angle distribution of radiation in the semiconductor body 2 can be spread more widely by comparison with a planar embodiment of the underside 5. The probability of radiation exiting from the semiconductor body is consequently increased. In particular the respective cut-out 21 can be filled with the insulation material of the insulation layer 19. This makes it possible simultaneously to reduce the charge carrier injection below the connection 18 into the active region 3.

In the edge region of the semiconductor body, too, the latter preferably has a cut-out 21, which is expediently filled with the insulation material. The risk of non-radiative recombination of charge carriers is particularly high in the edge region of the active region. By reducing the edge-side charge carrier injection into the semiconductor body, the proportion of charge carriers that recombine in non-radiative fashion can be reduced and the efficiency of the semiconductor body can consequently be increased.

By means of the cut-out(s) it is possible in particular to form a microprism-like structure in the semiconductor body.

On the part of the top side 4, the semiconductor body 2 has a coupling-out structure 20 corresponding to the semiconductor chip illustrated in FIG. 5.

Figure 7:
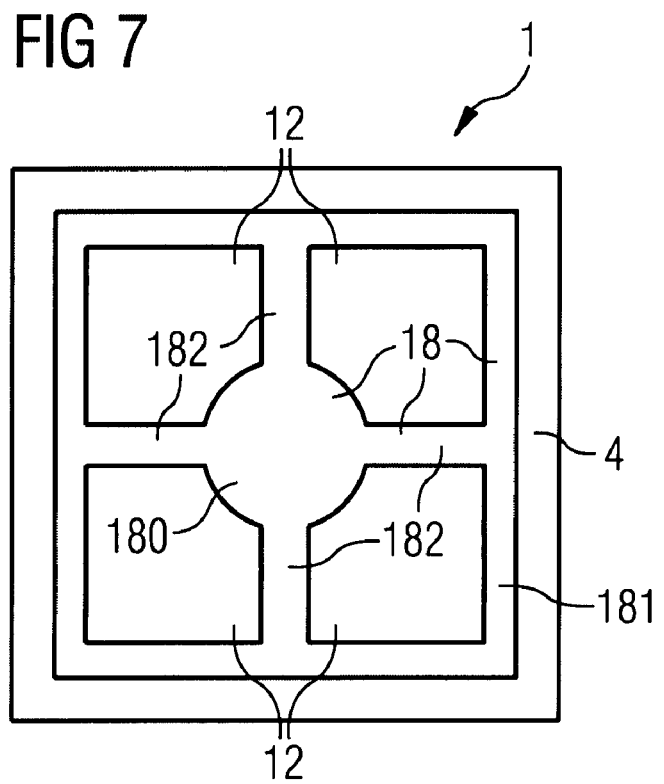
FIG. 7 shows a further exemplary embodiment of a semiconductor chip according to the invention on the basis of a schematic plan view.

FIG. 7 shows an exemplary embodiment of a semiconductor chip 1 on the basis of a schematic plan view of the first connection layer 12 on the part of the top side 4. In this case, the connection 18 is embodied as a connection structure preferably having, in addition to a connection region 180, a frame 181 formed on the edge side. The frame runs around the top side 4 of the semiconductor body and in particular the connection region preferably laterally. The frame 181 is electrically conductively connected to the connection region 180 by means of connecting webs 182. By means of this connection structure extending laterally extensively over the semiconductor body, it is possible to obtain—in particular in addition to current spreading in the first connection layer—a lateral current distribution over the top side 4 of the semiconductor body. The connection region 180 is preferably provided for wire bonding, that is to say for electrically conductive connection to a bonding wire. Furthermore, the connection region 180 is preferably provided centrally on the top side.

Such a connection structure can be used in the semiconductor chips described in connection with the previous figures.

On account of the cut-out, in particular grating-like formation of the connection 18, radiation exit from the semiconductor chip through the cut-out region, in particular in the grating gaps, is advantageously not reduced by absorption in the connection 18. By means of current spreading in the connection layer 12, charge carriers can advantageously pass into the semiconductor body to an increased extent even in the regions not covered by the connection structure.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

For example, the invention can also be applied to semiconductor bodies based on the III-V material system $In_xGa_yAl_{1-x-y}N$ or $In_xGa_yAl_{1-x-y}As$ in each case where $0 \leq x \leq 1$, $0 \leq y \leq 1$ and $x+y \leq 1$, where preferably in each case $y \neq 0$, $y \neq 1$, $x \neq 0$ and/or $x \neq 1$.

I claim:

1. A semiconductor body, comprising a semiconductor layer sequence with an active region suitable for generating radiation,
    wherein the semiconductor layer sequence comprises two contact layers, between which the active region is arranged;
    wherein the contact layers are assigned a respective connection layer arranged on the semiconductor body;
    wherein the respective connection layer is electrically conductively connected to the assigned contact layer;
    wherein the respective connection layer is arranged on that side of the assigned contact layer which is remote from the active region;
    wherein the connection layers are transmissive to the radiation to be generated in the active region; and
    wherein the contact layers are of the same conduction type.

2. The semiconductor body as claimed in claim 1, in which the active region is arranged between the connection layers.

3. The semiconductor body as claimed in claim 1, in which the connection layers contain a radiation-transmissive and electrically conductive oxide.

4. The semiconductor body as claimed in claim 1, in which the connection layers contain identical materials.

5. The semiconductor body as claimed in claim 3, in which both connection layers contain zinc oxide.

6. The semiconductor body as claimed in claim 3, in which both connection layers contain indium tin oxide.

7. The semiconductor body as claimed in claim 1, in which one connection layer adjoins one contact layer and the other connection layer adjoins the other contact layer.

8. The semiconductor body as claimed in claim 1, in which both contact layers are embodied in p-conducting fashion.

9. The semiconductor body as claimed in claim 1, in which one of the contact layers contains GaAs or AlGaAs or the contact layers contain GaAs or AlGaAs.

10. The semiconductor body as claimed in claim 1, in which the active region contains a material from the material system $In_xGa_yAl_{1-x-y}P$, where $0 \leq x \leq 1$, $0 \leq y \leq 1$ and $x+y \leq 1$.

11. The semiconductor body as claimed in claim 1, in which a tunnel junction is arranged between one of the connection layers and the active region.

12. The semiconductor body as claimed in claim 11, in which the tunnel junction is integrated in the semiconductor layer sequence and comprises two tunnel layers of different conduction types.

13. The semiconductor body as claimed in claim 11, in which a tunnel layer of the tunnel junction that is remote from the active region is formed as one of the contact layers, or in which a tunnel layer of the tunnel junction that is remote from the active region has the same conduction type as the contact layers.

14. The semiconductor body as claimed in claim 1, in which a mirror layer is arranged on that side of one of the connection layers which is remote from the semiconductor body.

15. The semiconductor body as claimed in claim 14, in which a tunnel junction is arranged between the mirror layer and the active region.

16. The semiconductor body as claimed in claim 14, in which a tunnel junction is arranged on that side of the active region which is remote from the mirror layer.

17. The semiconductor body as claimed in claim 14, in which the mirror layer contains Au.

18. The semiconductor body as claimed in claim 1, in which the semiconductor body is embodied as a thin-film semiconductor body.

19. The semiconductor body as claimed in claim 1, which is embodied as a luminescence diode semiconductor body.

20. A semiconductor chip, which comprises a semiconductor body as claimed in claim 1, and a carrier, wherein the semiconductor body is arranged on the carrier.

21. The semiconductor chip as claimed in claim 20, in which the carrier is different from a growth substrate of the semiconductor layer sequence.

* * * * *